(12) United States Patent
Sato et al.

(10) Patent No.: US 12,308,812 B2
(45) Date of Patent: May 20, 2025

(54) MULTILAYER ELECTRONIC COMPONENT

(71) Applicant: TDK CORPORATION, Tokyo (JP)

(72) Inventors: Takuya Sato, Tokyo (JP); Seisuke Mochizuka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 745 days.

(21) Appl. No.: 17/688,067

(22) Filed: Mar. 7, 2022

(65) Prior Publication Data

US 2022/0294409 A1 Sep. 15, 2022

(30) Foreign Application Priority Data

Mar. 11, 2021 (JP) .................................. 2021-039650

(51) Int. Cl.
| | |
|---|---|
| H03H 7/01 | (2006.01) |
| H01F 17/00 | (2006.01) |
| H03H 1/00 | (2006.01) |

(52) U.S. Cl.
CPC ....... *H03H 7/0115* (2013.01); *H01F 17/0013* (2013.01); *H01F 2017/002* (2013.01); *H01F 2017/0026* (2013.01); *H03H 2001/0085* (2013.01)

(58) Field of Classification Search
CPC ........... H01F 17/0013; H01F 2017/002; H01F 2017/0026
USPC ......................................................... 336/200
See application file for complete search history.

(56) References Cited

U.S. PATENT DOCUMENTS

| | | | | |
|---|---|---|---|---|
| 7,671,706 | B2* | 3/2010 | Taniguchi | H03H 7/1791 |
| | | | | 333/175 |
| 9,035,724 | B2* | 5/2015 | Imamura | H03H 7/1708 |
| | | | | 333/204 |
| 9,935,602 | B2* | 4/2018 | Imamura | H01F 27/2804 |
| 2007/0241839 | A1* | 10/2007 | Taniguchi | H03H 7/1725 |
| | | | | 333/204 |
| 2011/0074526 | A1* | 3/2011 | Taniguchi | H03H 7/1775 |
| | | | | 333/185 |
| 2015/0162888 | A1* | 6/2015 | Yunoki | H03H 7/0161 |
| | | | | 333/174 |
| 2017/0222616 | A1* | 8/2017 | Kitami | H03H 7/463 |
| 2019/0173447 | A1 | 6/2019 | Oishi | |
| 2023/0268902 | A1* | 8/2023 | Mori | H03H 7/0161 |
| | | | | 333/185 |

FOREIGN PATENT DOCUMENTS

| | | | | | |
|---|---|---|---|---|---|
| CN | 102986137 B | * | 6/2015 | .......... | H01P 1/20345 |
| CN | 109643977 A | * | 4/2019 | .......... | H01F 17/0013 |
| WO | WO-2018034103 A1 | * | 2/2018 | .......... | H01F 17/0013 |

* cited by examiner

*Primary Examiner* — Shawki S Ismail
*Assistant Examiner* — Joselito S. Baisa
(74) *Attorney, Agent, or Firm* — Oliff PLC

(57) ABSTRACT

An electronic component includes a first and second inductor forming sections integrated with a stack, and a connection conductor layer connecting the first and second inductor forming sections inside the stack. In the first inductor forming section, two first through hole lines are connected to a wide portion of an inductor conductor layer, and two second through hole lines are connected to a narrow portion of the inductor conductor layer. In the second inductor forming section, two first through hole lines are connected to a wide portion of an inductor conductor layer, and two second through hole lines are connected to a narrow portion of the inductor conductor layer.

7 Claims, 10 Drawing Sheets

MULTILAYER ELECTRONIC COMPONENT

BACKGROUND OF THE INVENTION

1. Field of the Invention

The present invention relates to a multilayer electronic component including inductors.

2. Description of the Related Art

The recent market demands for reductions in size and footprint of the compact mobile communication apparatuses have also required miniaturization of band-pass filters for use in those communication apparatuses. Among known band-pass filters suited for miniaturization are ones that use a stack of dielectric layers and conductor layers.

Some band-pass filters include a plurality of resonators. The plurality of resonators are configured so that two resonators adjoining in a circuit configuration are electromagnetically coupled with each other.

US 2019/0173447 A1 discloses a multilayer LC filter including a plurality of LC resonators inside a stack. In the multilayer LC filter, each LC resonator includes an inductor composed of line-shaped conductor traces and a plurality of via conductors. Each line-shaped conductor trace is formed so that its opposite long sides are nonparallel. Two via conductors are connected to the relatively longer one of the two opposite short sides of each line-shaped conductor trace, and one via conductor is connected to the relatively shorter one.

As the inductors are reduced in size for the miniaturization of the band-pass filter, the inductances and the Q values of the inductors also decrease. The inductances of the inductors configured as disclosed in US 2019/0173447 A1 can be increased by increasing the numbers of turns of the inductors. In such a case, contrivances are desired to increase the Q values as well. However, such contrivances have not heretofore been given due consideration.

The foregoing problem is not limited to band-pass filters and applies to multilayer electronic components including inductors in general.

SUMMARY OF THE INVENTION

An object of the present invention is to provide a multilayer electronic component including an inductor that has favorable characteristics and is suited for miniaturization.

A multilayer electronic component according to the present invention includes a stack including a plurality of dielectric layers stacked together, a first inductor forming section and a second inductor forming section that are integrated with the stack, and a connection conductor layer that connects the first inductor forming section and the second inductor forming section inside the stack. Each of the first and second inductor forming sections includes an inductor conductor layer, a plurality of first through hole lines, and a plurality of second through hole lines.

Each of the first through hole lines is formed by connecting two or more first through holes in series. Each of the second through hole lines is formed by connecting two or more second through holes in series. The number of first through hole lines and the number of second through hole lines are the same. In each of the first and second inductor forming sections, the plurality of first through hole lines are arranged in one direction orthogonal to a stacking direction of the dielectric layers, and the plurality of second through hole lines are arranged in another direction orthogonal to the stacking direction of the dielectric layers.

The inductor conductor layer has a wide end and a narrow end located at opposite ends in a longitudinal direction of the inductor conductor layer. The inductor conductor layer includes a wide portion including the wide end and a narrow portion including the narrow end. A dimension of the narrow portion in a transverse direction of the inductor conductor layer is smaller than a dimension of the wide portion in the transverse direction of the inductor conductor layer. The wide portion of the inductor conductor layer of the first inductor forming section and the narrow portion of the inductor conductor layer of the second inductor forming section adjoin at a predetermined distance. The narrow portion of the inductor conductor layer of the first inductor forming section and the wide portion of the inductor conductor layer of the second inductor forming section adjoin at a predetermined distance.

In each of the first and second inductor forming sections, the plurality of first through hole lines are connected to one of the wide and narrow portions, and the plurality of second through hole lines are connected to the other of the wide and narrow portions. The connection conductor layer connects a plurality of portions of the plurality of second through hole lines of the first inductor forming section away from the inductor conductor layer to a plurality of portions of the plurality of second through hole lines of the second inductor forming section away from the inductor conductor layer.

In the multilayer electronic component according to the present invention, the plurality of first through hole lines may be arranged in a first direction, and the plurality of second through hole lines may be arranged in a second direction intersecting the first direction. In such a case, the first direction and the second direction may be orthogonal to each other. One of the first and second directions may be parallel to the longitudinal direction of the inductor conductor layer, and the other of the first and second directions may be parallel to the transverse direction of the inductor conductor layer.

In the multilayer electronic component according to the present invention, the inductor conductor layer may further include a width changing portion interposed between the narrow portion and the wide portion. In such a case, a dimension of the width changing portion in the transverse direction of the inductor conductor layer may increase as a distance of the width changing portion from the narrow portion increases.

In the multilayer electronic component according to the present invention, the first inductor forming section, the second inductor forming section, and the connection conductor layer may constitute an inductor. In such a case, the multilayer electronic component according to the present invention may further include a first port, a second port, and a plurality of resonators that are provided between the first port and the second port in a circuit configuration and are configured so that two adjoining resonators in the circuit configuration are electromagnetically coupled to each other. The first port, the second port, and the plurality of resonators may be integrated with the stack. The plurality of resonators may include a first resonator closest to the first port in the circuit configuration and a second resonator closest to the second port in the circuit configuration. Each of the first and second resonators may include the inductor.

In each of the first and second inductor forming sections of the multilayer electronic component according to the present invention, the plurality of first through hole lines are connected to one of the wide and narrow portions of the inductor conductor layer, and the plurality of second through hole lines are connected to the other of the wide and narrow portions of the inductor conductor layer. The number of first through hole lines and the number of second through hole lines are the same. According to the present invention, a multilayer electronic component including an inductor that has favorable characteristics and is suited for miniaturization can thus be implemented.

Other and further objects, features and advantages of the present invention will appear more fully from the following description.

DETAILED DESCRIPTION OF THE PREFERRED EMBODIMENTS

Figure 1:
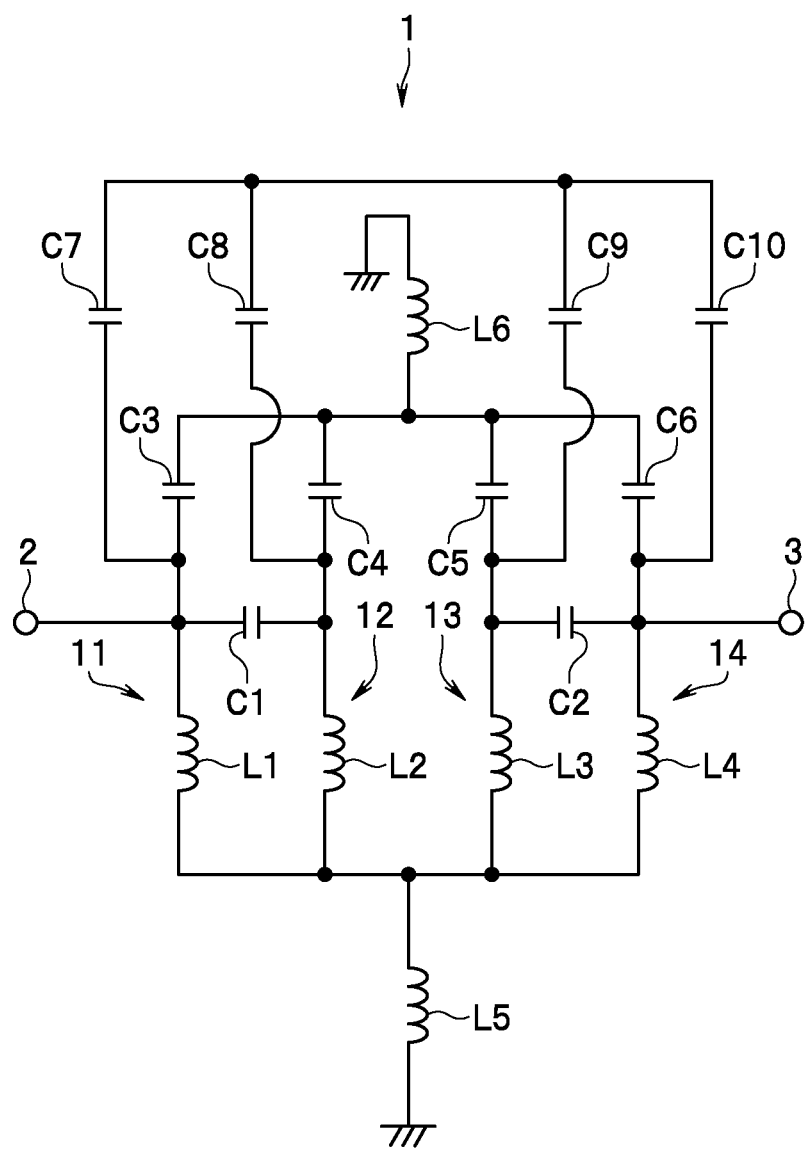
FIG. 1 is a circuit diagram showing circuit configuration of a multilayer electronic component according to an embodiment of the invention.

An embodiment of the present invention will now be described in detail with reference to the drawings. First, a configuration of a multilayer electronic component (hereinafter simply referred to as electronic component) according to the embodiment of the invention will be outlined with reference to FIG. 1. The electronic component 1 according to the present embodiment includes at least an inductor. In FIG. 1, a band-pass filter is shown as an example of the electronic component 1 including an inductor.

The electronic component 1 includes a first port 2, a second port 3, and a plurality of resonators provided between the first port 2 and the second port 3 in circuit configuration. The plurality of resonators are configured so that two adjoining resonators in the circuit configuration are electromagnetically coupled with each other. Each of the resonators includes an inductor.

In the present embodiment, the plurality of resonators are four resonators 11, 12, 13, and 14. The resonator 11 is the closest to the first port 2 in the circuit configuration. The resonator 14 is the closest to the second port 3 in the circuit configuration. The resonators 12 and 13 are located between the resonator 11 and the resonator 14 in the circuit configuration. In the present application, the expression of "in a (the) circuit configuration" is used not to indicate layout in physical configuration but to indicate layout in the circuit diagram.

The resonator 11 corresponds to "the first resonator" in the present invention. The resonator 14 corresponds to "the second resonator" in the present invention.

An example of the circuit configuration of the electronic component 1 including the band-pass filter will be described below with reference to FIG. 1. FIG. 1 shows the components of the band-pass filter included in the electronic component 1. The electronic component 1 further includes inductors L1, L2, L3, L4, L5, and L6, and capacitors C1, C2, C3, C4, C5, C6, C7, C8, C9, and C10.

One end of the inductor L1 is connected to the first port 2. The capacitor C1 connects the one end of the inductor L1 and one end of the inductor L2. One end of the inductor L4 is connected to the second port 3. The capacitor C2 connects one end of the inductor L3 and the one end of the inductor L4. The inductor L5 connects the other ends of the respective inductors L1 to L4 to a ground.

One end of each of the capacitors C3 and C7 is connected to the one end of the inductor L1. One end of each of the capacitors C4 and C8 is connected to the one end of the inductor L2. One end of each of the capacitors C5 and C9 is connected to the one end of the inductor L3. One end of each of the capacitors C6 and C10 is connected to the one end of the inductor L4. The inductor L6 connects the other ends of the respective capacitors C3 to C6 to the ground. The other ends of the respective capacitors C7 to C10 are connected to each other.

The resonator 11 includes the inductor L1. The resonator 12 includes the inductor L2. The resonator 13 includes the inductor L3. The resonator 14 includes the inductor L4.

Figure 2:
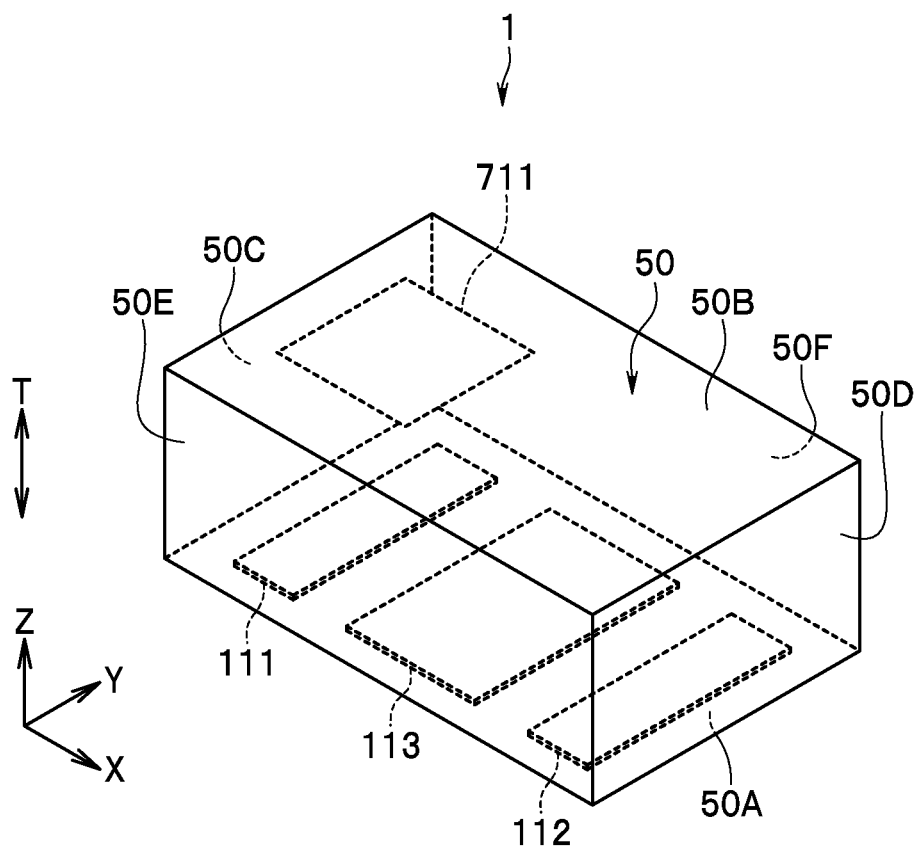
FIG. 2 is a perspective view showing an outside view of the multilayer electronic component according to the embodiment of the invention.

Next, other configurations of the electronic component 1 will be described with reference to FIG. 2. FIG. 2 is a perspective view showing an outside view of the electronic component 1.

The electronic component 1 further includes a stack 50 including a plurality of dielectric layers stacked together. The components of the band-pass filter shown in FIG. 1 are integrated with the stack 50. As will be described below, the components of the band-pass filter are formed using a plurality of conductors formed in the stack 50.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as —X, —Y, and —Z directions, respectively.

As shown in FIG. 2, the bottom surface 50A is located at the end of the stack 50 in the —Z direction. The top surface 50B is located at the end of the stack 50 in the Z direction. The bottom surface 50A and the top surface 50B each have a rectangular shape long in the X direction. The side surface 50C is located at the end of the stack 50 in the —X direction. The side surface 50D is located at the end of the stack 50 in the X direction. The side surface 50E is located at the end of the stack 50 in the —Y direction. The side surface 50F is located at the end of the stack 50 in the Y direction.

The electronic component 1 further includes a plurality of terminals 111, 112, and 113 located at the bottom surface 50A of the stack 50. The terminal 111 extends in the Y direction near the side surface 50C. The terminal 112 extends in the Y direction near the side surface 50D. The terminal 113 is located between the terminal 111 and the terminal 112.

The terminal 111 corresponds to the first port 2. The terminal 112 corresponds to the second port 3. The first and second ports 2 and 3 are thus located at the bottom surface 50A of the stack 50. The terminal 113 is connected to the ground.

Next, an example of the plurality of dielectric layers constituting the stack 50 will be described with reference to FIG. 3A to FIG. 6C. In this example, the stack 50 includes twenty-one dielectric layers stacked together. The twenty-one dielectric layers will be referred to as a first to a twenty-first dielectric layer in the order from bottom to top. The first to twenty-first dielectric layers are denoted by reference numerals 51 to 71, respectively.

Figure 3A:
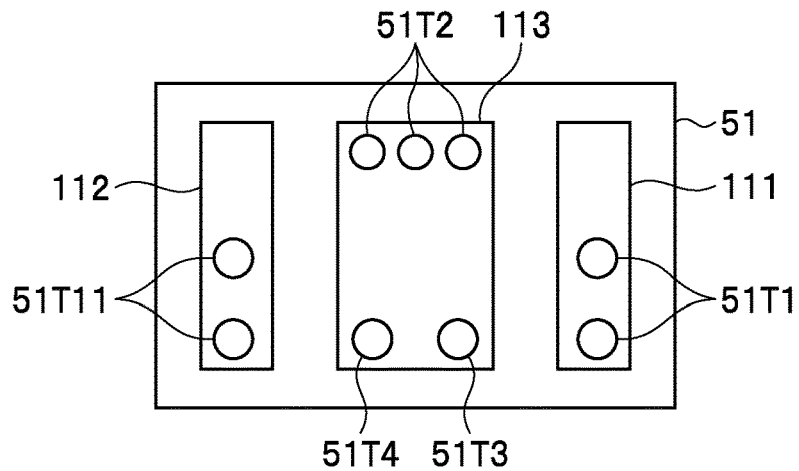
FIG. 3A to FIG. 3C are explanatory diagrams showing respective patterned surfaces of first to third dielectric layers of a stack of the multilayer electronic component according to the embodiment of the invention.

FIG. 3A shows the patterned surface of the first dielectric layer 51. The terminals 111, 112, and 113 are formed on the patterned surface of the dielectric layer 51. Further, two through holes 51T1, three through holes 51T2, though holes 51T3 and 51T4, and two through holes 51T11 are formed in the dielectric layer 51. The through holes 51T1 are connected to the terminal 111. The through holes 51T2 to 51T4 are connected to the terminal 113. The through holes 51T11 are connected to the terminal 112.

Figure 3B:
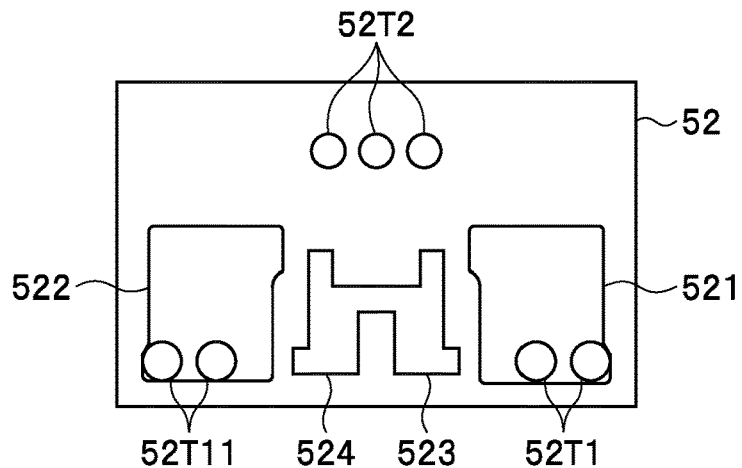

FIG. 3B shows the patterned surface of the second dielectric layer 52. Conductor layers 521, 522, 523, and 524 are formed on the patterned surface of the dielectric layer 52. The conductor layer 524 is connected to the conductor layer 523. Further, two through holes 52T1, three through holes 52T2, and two through holes 52T11 are formed in the dielectric layer 52. The through holes 51T1 formed in the dielectric layer 51 and the through holes 52T1 are connected to the conductor layer 521. The through holes 51T2 formed in the dielectric layer 51 are connected to the through holes 52T2. The through hole 51T3 formed in the dielectric layer 51 is connected to the conductor layer 523. The through hole 51T4 formed in the dielectric layer 51 is connected to the conductor layer 524. The through holes 51T11 formed in the dielectric layer 51 and the through holes 52T11 are connected to the conductor layer 522.

Figure 3C:
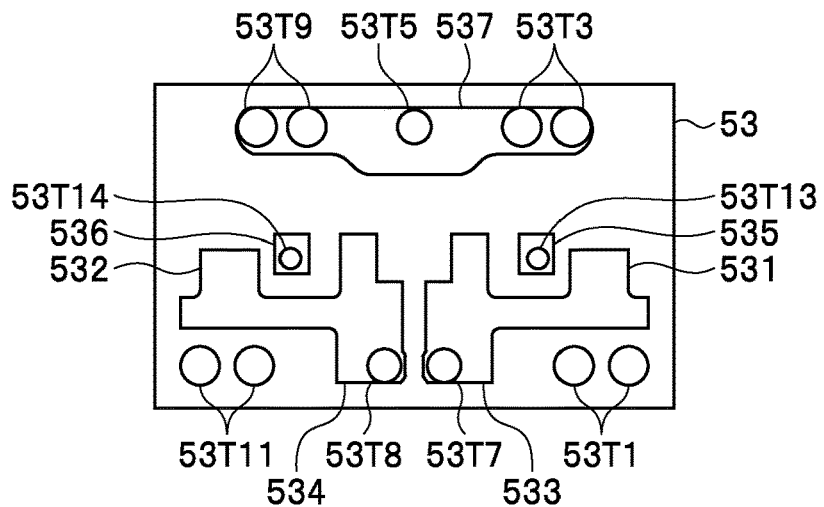

FIG. 3C shows the patterned surface of the third dielectric layer 53. Conductor layers 531, 532, 533, 534, 535, 536, and 537 are formed on the patterned surface of the dielectric layer 53. The conductor layer 533 is connected to the conductor layer 531. The conductor layer 534 is connected to the conductor layer 532. Further, two through holes 53T1, two through holes 53T3, through holes 53T5, 53T7, and 53T8, two through holes 53T9, two through holes 53T11, and through holes 53T13 and 53T14 are formed in the dielectric layer 53. The through holes 52T1 and 52T11 formed in the dielectric layer 52 are connected to the through holes 53T1 and 53T11, respectively. The through holes 52T2 formed in the dielectric layer 52, and through holes 53T3, 53T5, and 53T9 are connected to the conductor layer 537. The through holes 53T7, 53T8, 53T13, and 53T14 are connected to the conductor layer 533, 534, 535, and 536, respectively.

Figure 4A:
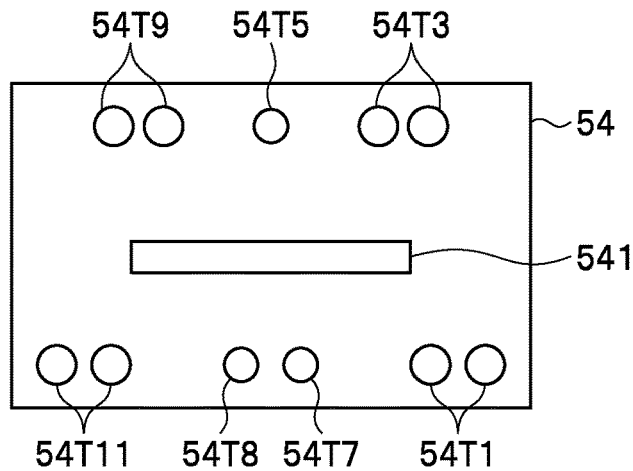
FIG. 4A to FIG. 4C are explanatory diagrams showing respective patterned surfaces of fourth to sixth dielectric layers of the stack of the multilayer electronic component according to the embodiment of the invention.

FIG. 4A shows the patterned surface of the fourth dielectric layer 54. A conductor layer 541 is formed on the patterned surface of the dielectric layer 54. The through holes 53T13 and 53T14 formed in the dielectric layer 53 are connected to the conductor layer 541. Further, two through holes 54T1, two through holes 54T3, through holes 54T5, 54T7 and 54T8, two through holes 54T9, and two through holes 54T11 are formed in the dielectric layer 54. The through holes 53T1, 53T3, 53T5, 53T7, 53T8, 53T9, and 53T11 formed in the dielectric layer 53 are connected to the through holes 54T1, 54T3, 54T5, 54T7, 54T8, 54T9, and 54T11, respectively.

Figure 4B:
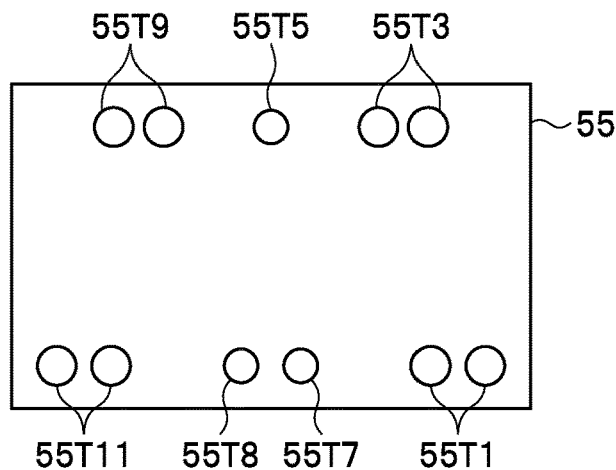

FIG. 4B shows the patterned surface of the fifth dielectric layer 55. Two through holes 55T1, two through holes 55T3, through holes 55T5, 55T7, and 55T8, two through holes 55T9, and two through holes 55T11 are formed in the dielectric layer 55. The through holes 54T1, 54T3, 54T5, 54T7, 54T8, 54T9, and 54T11 formed in the dielectric layer 54 are connected to the through holes 55T1, 55T3, 55T5, 55T7, 55T8, 55T9, and 55T11, respectively.

Figure 4C:
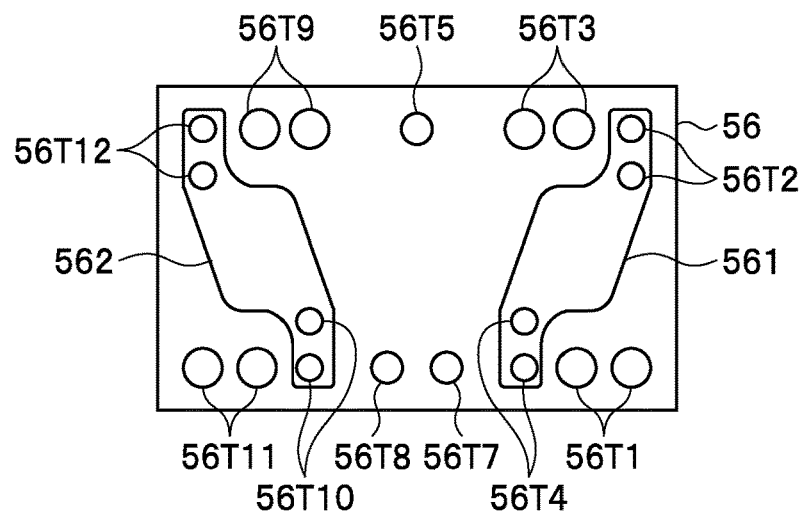

FIG. 4C shows the patterned surface of the sixth dielectric layer 56. Connection conductor layers 561 and 562 are formed on the patterned surface of the dielectric layer 56. The conductor layer 561 has a first end and a second end located at opposite ends in a longitudinal direction of the dielectric layer 561. The conductor layer 562 has a first end and a second end located at opposite ends in a longitudinal direction of the conductor layer 562.

Further, two through holes 56T1, two through holes 56T2, two through holes 56T3, two through holes 56T4, through holes 56T5, 56T7 and 56T8, two through holes 56T9, two through holes 56T10, two through holes 56T11, and two through holes 56T12 are formed in the dielectric layer 56. The through holes 55T1, 55T3, 55T5, 55T7, 55T8, 55T9, and 55T11 formed in the dielectric layer 55 are connected to the through holes 56T1, 56T3, 56T5, 56T7, 56T8, 56T9, and 56T11, respectively.

The through holes 56T2 are connected to a portion of the conductor layer 561 near the first end thereof. The through holes 56T4 are connected to a portion of the conductor layer 561 near the second end thereof. The through holes 56T10 are connected to a portion of the conductor layer 562 near the first end thereof. The through holes 56T12 are connected to a portion of the conductor layer 562 near the second end thereof.

Figure 5A:
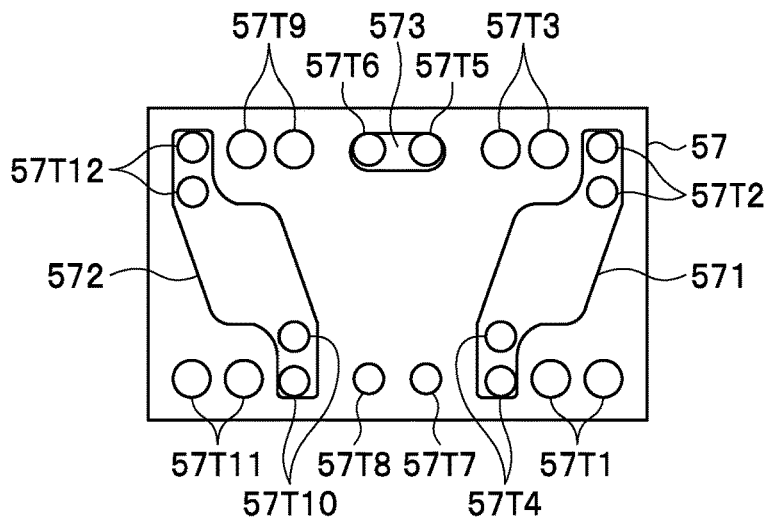
FIG. 5A is an explanatory diagram showing a patterned surface of a seventh dielectric layer of the stack of the multilayer electronic component according to the embodiment of the invention.

FIG. 5A shows the patterned surface of the seventh dielectric layer 57.

Connection conductor layers 571 and 572 and a conductor layer 573 are formed on the patterned surface of the dielectric layer 57. The conductor layer 571 has a first end and a second end located at opposite ends in a longitudinal direction of the conductor layer 571. The conductor layer 572 has a first end and a second end located at opposite ends in a longitudinal direction of the conductor layer 572.

Further, two through holes 57T1, two through holes 57T2, two through holes 57T3, two through holes 57T4, through holes 57T5, 57T6, 57T7 and 57T8, two through holes 57T9, two through holes 57T10, two through holes 57T11, and two through holes 57T12 are formed in the dielectric layer 57. The through holes 56T1, 56T3, 56T7, 56T8, 56T9, and 56T11 formed in the dielectric layer 56 are connected to the through holes 57T1, 57T3, 57T7, 57T8, 57T9, and 57T11, respectively.

The through holes 56T2 formed in the dielectric layer 56 and the through holes 57T2 are connected to a portion of the conductor layer 571 near the first end thereof. The through holes 56T4 formed in the dielectric layer 56 and the through holes 57T4 are connected to a portion of the conductor layer 571 near the second end thereof. The through hole 56T5 formed in the dielectric layer 56 and the through holes 57T5, 57T6 are connected to the conductor layer 573. The through holes 56T10 formed in the dielectric layer 56 and the through holes 57T10 are connected to a portion of the conductor layer 572 near the first end thereof. The through holes 56T12 formed in the dielectric layer 56 and the through holes 57T12 are connected to a portion of the conductor layer 572 near the second end thereof.

Figure 5B:
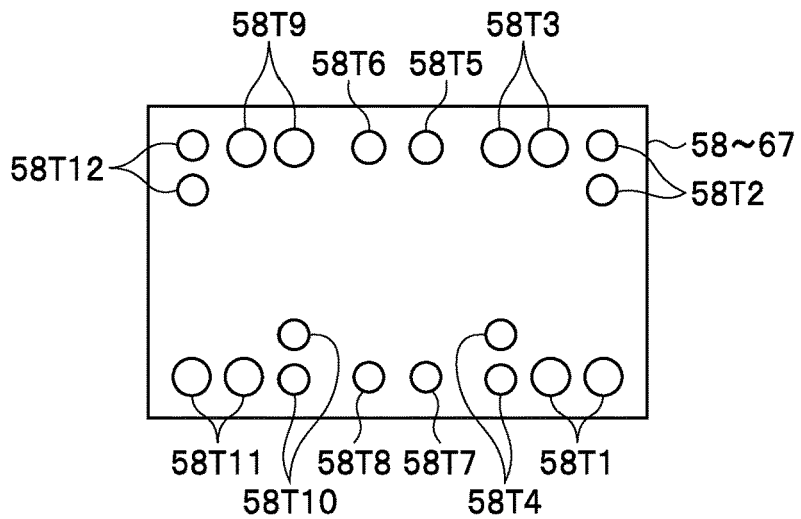
FIG. 5B is an explanatory diagram showing respective patterned surfaces of eighth to seventeenth dielectric layers of the stack of the multilayer electronic component according to the embodiment of the invention.

FIG. 5B shows the patterned surface of each of the eighth to seventeenth dielectric layers 58 to 67. In each of the dielectric layers 58 to 67, there are formed two through holes 58T1, two through holes 58T2, two through holes 58T3, two through holes 58T4, through holes 58T5, 58T6, 58T7 and 58T8, two through holes 58T9, two through holes 58T10, two through holes 58T11, and two through holes 58T12. The through holes 57T1 to 57T11 formed in the dielectric layer 57 are connected to the through holes 58T1 to 58T11 formed in the dielectric layer 58, respectively. In the dielectric layers 58 to 67, every vertically adjacent through holes denoted by the same reference numerals are connected to each other.

Figure 5C:
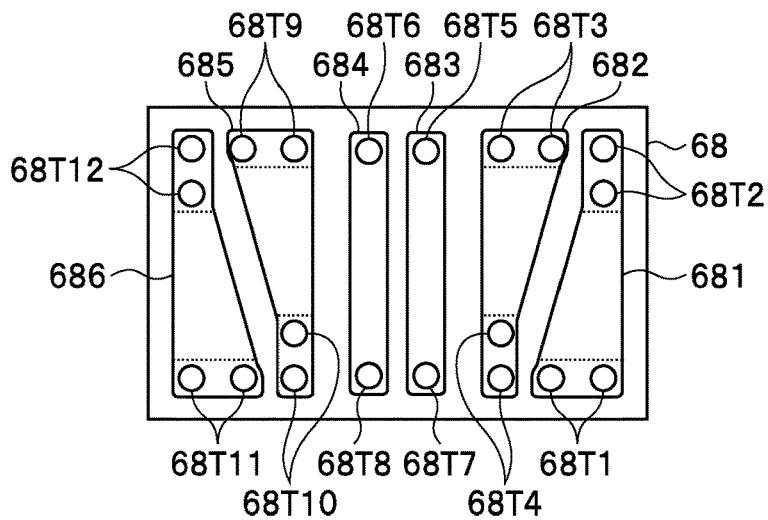
FIG. 5C is an explanatory diagram showing a patterned surface of an eighteenth dielectric layer of the stack of the multilayer electronic component according to the embodiment of the invention.

FIG. 5C shows the patterned surface of the eighteenth dielectric layer 68. Inductor conductor layers 681, 682, 683, 684, 685, and 686 are formed on the patterned surface of the dielectric layer 68. Each of the inductor conductor layers 681, 682, 683, 684, 685, and 686 extends vertically in FIG. 5C, i.e., in a direction parallel to the Y direction shown in FIG. 2. The inductor conductor layer 681 has a wide end and a narrow end located at opposite ends in a longitudinal direction of the inductor conductor layer 681. The wide end is an end having a relatively large width. The narrow end is an end having a relatively small width.

Like the inductor conductor layer 681, the inductor conductor layer 682 has a wide end and a narrow end located at opposite ends in a longitudinal direction of the inductor conductor layer 682. The inductor conductor layer 685 has a wide end and a narrow end located at opposite ends in a longitudinal direction of the inductor conductor layer 685. The inductor conductor layer 686 has a wide end and a narrow end located at opposite ends in a longitudinal direction of the inductor conductor layer 686.

The inductor conductor layer 683 has a first end and a second end located at opposite ends in a longitudinal direction of the inductor conductor layer 683. The inductor conductor layer 684 has a first end and a second end located at opposite ends in a longitudinal direction of the inductor conductor layer 684.

Further, two through holes 68T1, two through holes 68T2, two through holes 68T3, two through holes 68T4, through holes 68T5, 68T6, 68T7 and 68T8, two through holes 68T9, two through holes 68T10, two through holes 68T11, and two through holes 68T12 are formed in the dielectric layer 68.

The through holes 58T1 formed in the dielectric layer 67 and the through holes 68T1 are connected to a portion of the inductor conductor layer 681 near the wide end thereof. The through holes 58T2 formed in the dielectric layer 67 and the through holes 68T2 are connected to a portion of the inductor conductor layer 681 near the narrow end thereof. The through holes 58T3 formed in the dielectric layer 67 and the through holes 68T3 are connected to a portion of the inductor conductor layer 682 near the wide end thereof. The through holes 58T4 formed in the dielectric layer 67 and the through holes 68T4 are connected to a portion of the inductor conductor layer 682 near the narrow end thereof.

The through hole 58T5 formed in the dielectric layer 67 and the through hole 68T5 are connected to a portion of the inductor conductor layer 683 near the first end thereof. The through hole 58T6 formed in the dielectric layer 67 and the through hole 68T6 are connected to a portion of the inductor conductor layer 684 near the first end thereof. The through hole 58T7 formed in the dielectric layer 67 and the through hole 68T7 are connected to a portion of the inductor conductor layer 683 near the second end thereof. The through hole 58T8 formed in the dielectric layer 67 and the through hole 68T8 are connected to a portion of the inductor conductor layer 684 near the second end thereof.

The through holes 58T9 formed in the dielectric layer 67 and the through holes 68T9 are connected to a portion of the inductor conductor layer 685 near the wide end thereof. The through holes 58T10 formed in the dielectric layer 67 and the through holes 68T10 are connected to a portion of the inductor conductor layer 685 near the narrow end thereof. The through holes 58T11 formed in the dielectric layer 67 and the through holes 68T11 are connected to a portion of the inductor conductor layer 686 near the wide end thereof. The through holes 58T12 formed in the dielectric layer 67 and the through holes 68T12 are connected to a portion of the inductor conductor layer 686 near the narrow end thereof.

Figure 6A:
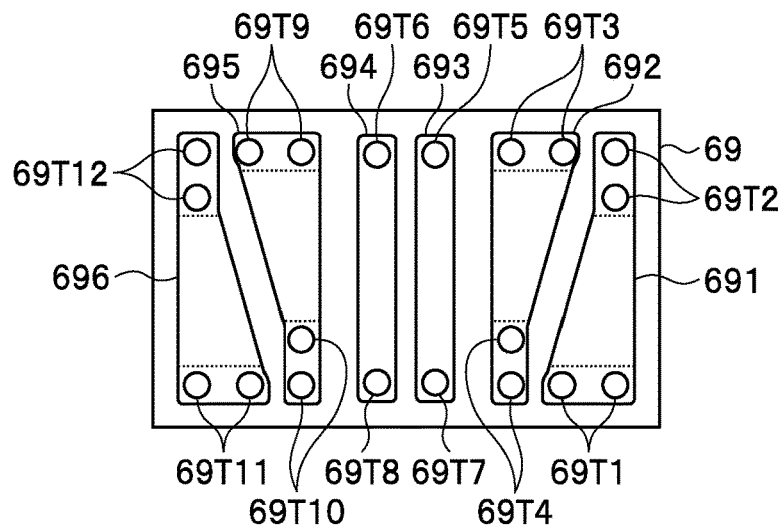
FIG. 6A to FIG. 6C are explanatory diagrams showing respective patterned surfaces of nineteenth to twenty-first dielectric layers of the stack of the multilayer electronic component according to the embodiment of the invention.

FIG. 6A shows the patterned surface of the nineteenth dielectric layer 69. Inductor conductor layers 691, 692, 693, 694, 695, and 696 are formed on the patterned surface of the dielectric layer 69. Each of the inductor conductor layers 691, 692, 693, 694, 695, and 696 extends vertically in FIG. 6A, i.e., in a direction parallel to the Y direction shown in FIG. 2. The inductor conductor layer 691 has a wide end and a narrow end located at opposite ends in a longitudinal direction of the inductor conductor layer 691.

Like the inductor conductor layer 691, the inductor conductor layer 692 has a wide end and a narrow end located at opposite ends in a longitudinal direction of the inductor conductor layer 692. The inductor conductor layer 695 has a wide end and a narrow end located at opposite ends in a longitudinal direction of the inductor conductor layer 695. The inductor conductor layer 696 has a wide end and a narrow end located at opposite ends in a longitudinal direction of the inductor conductor layer 696.

The inductor conductor layer 693 has a first end and a second end located at opposite ends in a longitudinal direction of the inductor conductor layer 693. The inductor conductor layer 694 has a first end and a second end located at opposite ends in a longitudinal direction of the inductor conductor layer 694.

Further, two through holes 69T1, two through holes 69T2, two through holes 69T3, two through holes 69T4, through holes 69T5, 69T6, 69T7, and 69T8, two through holes 69T9, two through holes 69T10, two through holes 69T11, and two through holes 69T12 are formed in the dielectric layer 69.

The through holes 68T1 formed in the dielectric layer 68 and the through holes 69T1 are connected to a portion of the inductor conductor layer 691 near the wide end thereof. The through holes 68T2 formed in the dielectric layer 68 and the through holes 69T2 are connected to a portion of the inductor conductor layer 691 near the narrow end thereof. The through holes 68T3 formed in the dielectric layer 68 and the through holes 69T3 are connected to a portion of the inductor conductor layer 692 near the wide end thereof. The through holes 68T4 formed in the dielectric layer 68 and the through holes 69T4 are connected to a portion of the inductor conductor layer 692 near the narrow end thereof.

The through hole 68T5 formed in the dielectric layer 68 and the through hole 69T5 are connected to a portion of the inductor conductor layer 693 near the first end thereof. The through hole 68T6 formed in the dielectric layer 68 and the through hole 69T6 are connected to a portion of the inductor conductor layer 694 near the first end thereof. The through hole 68T7 formed in the dielectric layer 68 and the through hole 69T7 are connected to a portion of the inductor conductor layer 693 near the second end thereof. The through hole 68T8 formed in the dielectric layer 68 and the through hole 69T8 are connected to a portion of the inductor conductor layer 694 near the second end thereof.

The through holes 68T9 formed in the dielectric layer 68 and the through holes 69T9 are connected to a portion of the inductor conductor layer 695 near the wide end thereof. The through holes 68T10 formed in the dielectric layer 68 and the through holes 69T10 are connected to a portion of the inductor conductor layer 695 near the narrow end thereof. The through holes 68T11 formed in the dielectric layer 68 and the through holes 69T11 are connected to a portion of the inductor conductor layer 696 near the wide end thereof. The through holes 68T12 formed in the dielectric layer 68 and the through holes 69T12 are connected to a portion of the inductor conductor layer 696 near the narrow end thereof.

Figure 6B:
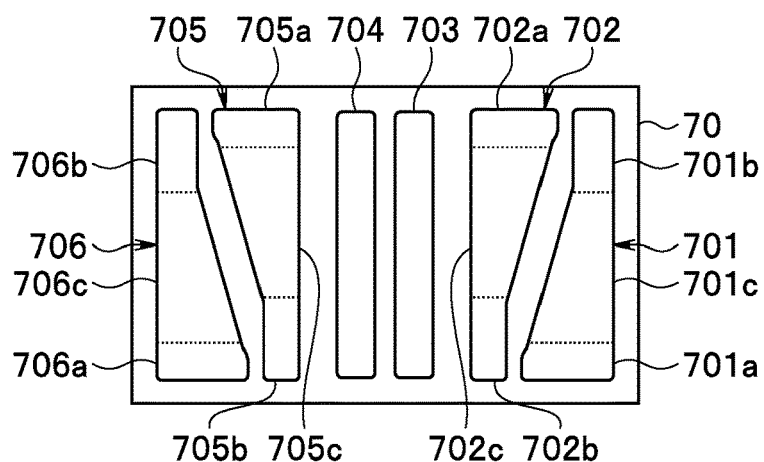

FIG. 6B shows the patterned surface of the twentieth dielectric layer 70. Inductor conductor layers 701, 702, 703, 704, 705, and 706 are formed on the patterned surface of the dielectric layer 70. Each of the inductor conductor layers 701, 702, 703, 704, 705, and 706 extends vertically in FIG. 6B, i.e., in a direction parallel to the Y direction shown in FIG. 2. The inductor conductor layer 701 has a wide end and a narrow end located at opposite ends in a longitudinal direction of the inductor conductor layer 701.

Like the inductor conductor layer 701, the inductor conductor layer 702 has a wide end and a narrow end located at opposite ends in a longitudinal direction of the inductor conductor layer 702. The inductor conductor layer 705 has a wide end and a narrow end located at opposite ends in a longitudinal direction of the inductor conductor layer 705. The inductor conductor layer 706 has a wide end and a narrow end located at opposite ends in a longitudinal direction of the inductor conductor layer 706.

The inductor conductor layer 703 has a first end and a second end located at opposite ends in a longitudinal direction of the inductor conductor layer 703. The inductor conductor layer 704 has a first end and a second end located at opposite ends in a longitudinal direction of the inductor conductor layer 704.

The through holes 69T1 formed in the dielectric layer 69 are connected to a portion of the inductor conductor layer 701 near the wide end thereof. The through holes 69T2 formed in the dielectric layer 69 are connected to a portion of the inductor conductor layer 701 near the narrow end thereof. The through holes 69T3 formed in the dielectric layer 69 are connected to a portion of the inductor conductor layer 702 near the wide end thereof. The through holes 69T4 formed in the dielectric layer 69 are connected to a portion of the inductor conductor layer 702 near the narrow end thereof.

The through hole 69T5 formed in the dielectric layer 69 is connected to a portion of the inductor conductor layer 703 near the first end thereof. The through hole 69T6 formed in the dielectric layer 69 is connected to a portion of the inductor conductor layer 704 near the first end thereof. The through hole 69T7 formed in the dielectric layer 69 is connected to a portion of the inductor conductor layer 703 near the second end thereof. The through hole 69T8 formed in the dielectric layer 69 is connected to a portion of the inductor conductor layer 704 near the second end thereof.

The through holes 69T9 formed in the dielectric layer 69 are connected to a portion of the inductor conductor layer 705 near the wide end thereof. The through holes 69T10 formed in the dielectric layer 69 are connected to a portion of the inductor conductor layer 705 near the narrow end thereof. The through holes 69T11 formed in the dielectric layer 69 are connected to a portion of the inductor conductor layer 706 near the wide end thereof. The through holes 69T12 formed in the dielectric layer 69 are connected to a portion of the inductor conductor layer 706 near the narrow end thereof.

Figure 6C:
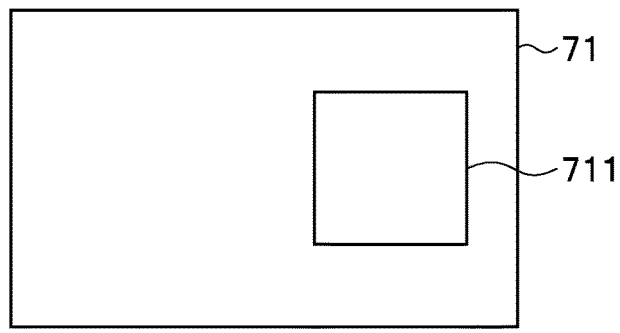

FIG. 6C shows the patterned surface of the twenty-first dielectric layer 71. A mark 711 made of a conductor layer is formed on the patterned surface of the dielectric layer 71.

The stack 50 shown in FIG. 2 is formed by stacking the first to twenty-first dielectric layers 51 to 71 such that the patterned surface of the first dielectric layer 51 serves as the bottom surface 50A of the stack 50 and the surface of the twenty-first dielectric layer 71 opposite to the patterned surface thereof serves as the top surface 50B of the stack 50.

Figure 7:
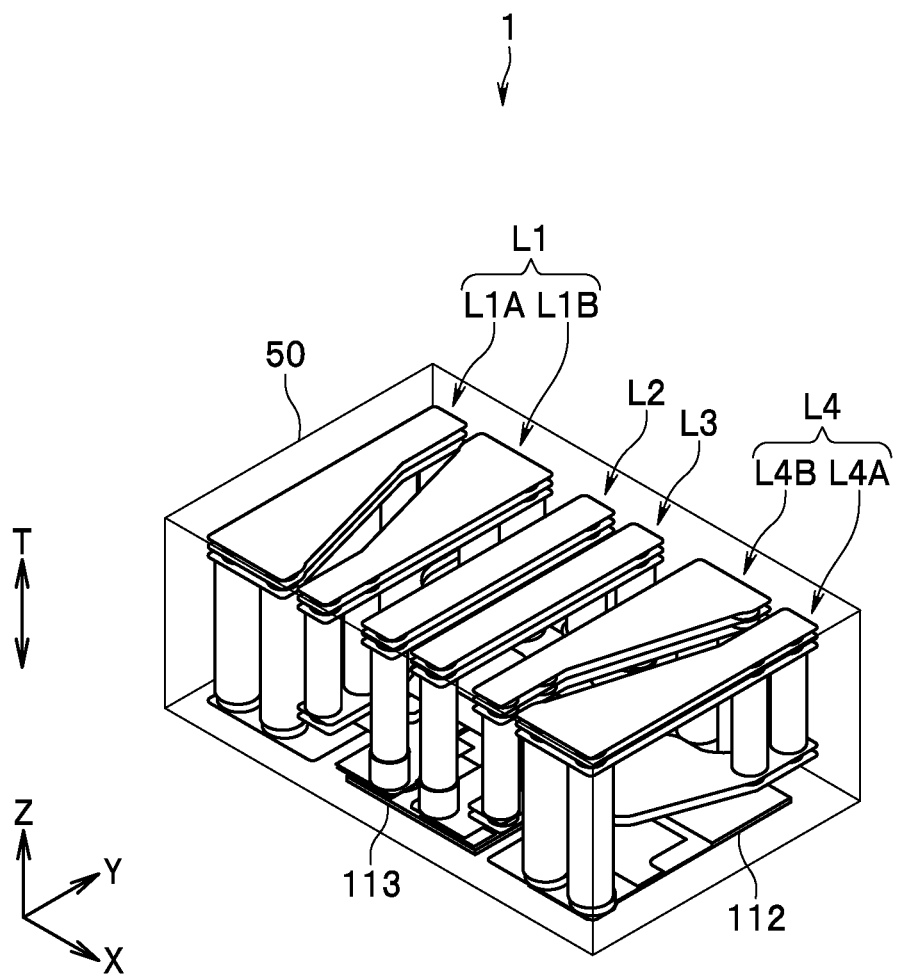
FIG. 7 is a perspective view showing an internal structure of the stack of the multilayer electronic component according to the embodiment of the invention.

FIG. 7 shows the internal structure of the stack 50 formed by stacking the first to twentieth dielectric layers 51 to 71. As shown in FIG. 7, the plurality of conductor layers and the plurality of through holes shown in FIG. 3A to FIG. 6C are stacked inside the stack 50. In FIG. 7, the mark 711 is omitted.

Correspondences between the circuit components of the electronic component 1 shown in FIG. 1 and the internal components of the stack 50 shown in FIG. 3A to FIG. 6B will now be described. The inductor L1 is composed of the conductor layers 561, 571, 681, 682, 691, 692, 701, and 702, and the through holes 53T1, 53T3, 54T1, 54T3, 55T1, 55T3, 56T1 to 56T4, 57T1 to 57T4, 58T1 to 58T4, 68T1 to 68T4, and 69T1 to 69T4 shown in FIG. 3C to FIG. 6B.

The inductor L2 is composed of the conductor layers 683, 693, and 703, and the through holes 53T7, 54T7, 55T7, 56T7 57T5, 57T7, 58T5, 58T7, 68T5, 68T7, 69T5, and 69T7 shown in FIG. 3C to FIG. 6B.

The inductor L3 is composed of the conductor layers 684, 694, and 704, and the through holes 53T8, 54T8, 55T8, 56T8, 57T6, 57T8, 58T6, 58T8, 68T6, 68T8, 69T6, and 69T8 shown in FIG. 3C to FIG. 6B.

The inductor LA is composed of the conductor layers 562, 572, 685, 686, 695, 696, 705, and 706, and the through holes 53T9, 53T11, 54T9, 54T11, 55T9, 55T11, 56T9 to 56T12, 57T9 to 57T12, 58T9 to 58T12, 68T9 to 68T12, and 69T9 to 69T12 shown in FIG. 3C to FIG. 6B.

The inductor L5 is composed of the through holes 51T2 and 52T2 shown in FIG. 3A and FIG. 3B. The inductor L6 is composed of the through holes 51T3 and 51T4 shown in FIG. 3A.

The capacitor C1 is composed of the conductor layers 521 and 531 shown in FIG. 3B and FIG. 3C, and the dielectric layer 52 interposed between those conductor layers. The capacitor C2 is composed of the conductor layers 522 and 532 shown in FIG. 3B and FIG. 3C, and the dielectric layer 52 interposed between those conductor layers.

The capacitor C3 is composed of the terminal 111 shown in FIG. 3A, the conductor layer 537 shown in FIG. 3C, and the dielectric layers 51 and 52 each interposed between the terminal 111 and the conductor layer 537. The capacitor C4 is composed of the conductor layers 523 and 533 shown in FIG. 3B and FIG. 3C, and the dielectric layer 52 interposed between those conductor layers. The capacitor C5 is composed of the conductor layers 524 and 534 shown in FIG. 3B and FIG. 3C, and the dielectric layer 52 interposed between those conductor layers. The capacitor C6 is composed of the terminal 112 shown in FIG. 3A, the conductor layer 537 shown in FIG. 3C, and the dielectric layers 51 and 52 each interposed between the terminal 112 and the conductor layer 537.

The capacitor C7 is composed of the conductor layers 521 and 535 shown in FIG. 3B and FIG. 3C, and the dielectric layer 52 interposed between those conductor layers. The capacitor C8 is composed of the conductor layers 533 and 541 shown in FIG. 3C and FIG. 4A, and the dielectric layer 53 interposed between those conductor layers. The capacitor C9 is composed of the conductor layers 534 and 541 shown in FIG. 3C and FIG. 4A, and the dielectric layer 53 interposed between those conductor layers. The capacitor C10 is composed of the conductor layers 522 and 536 shown in FIG. 3B and FIG. 3C, and the dielectric layer 52 interposed between those conductor layers.

Figure 8:
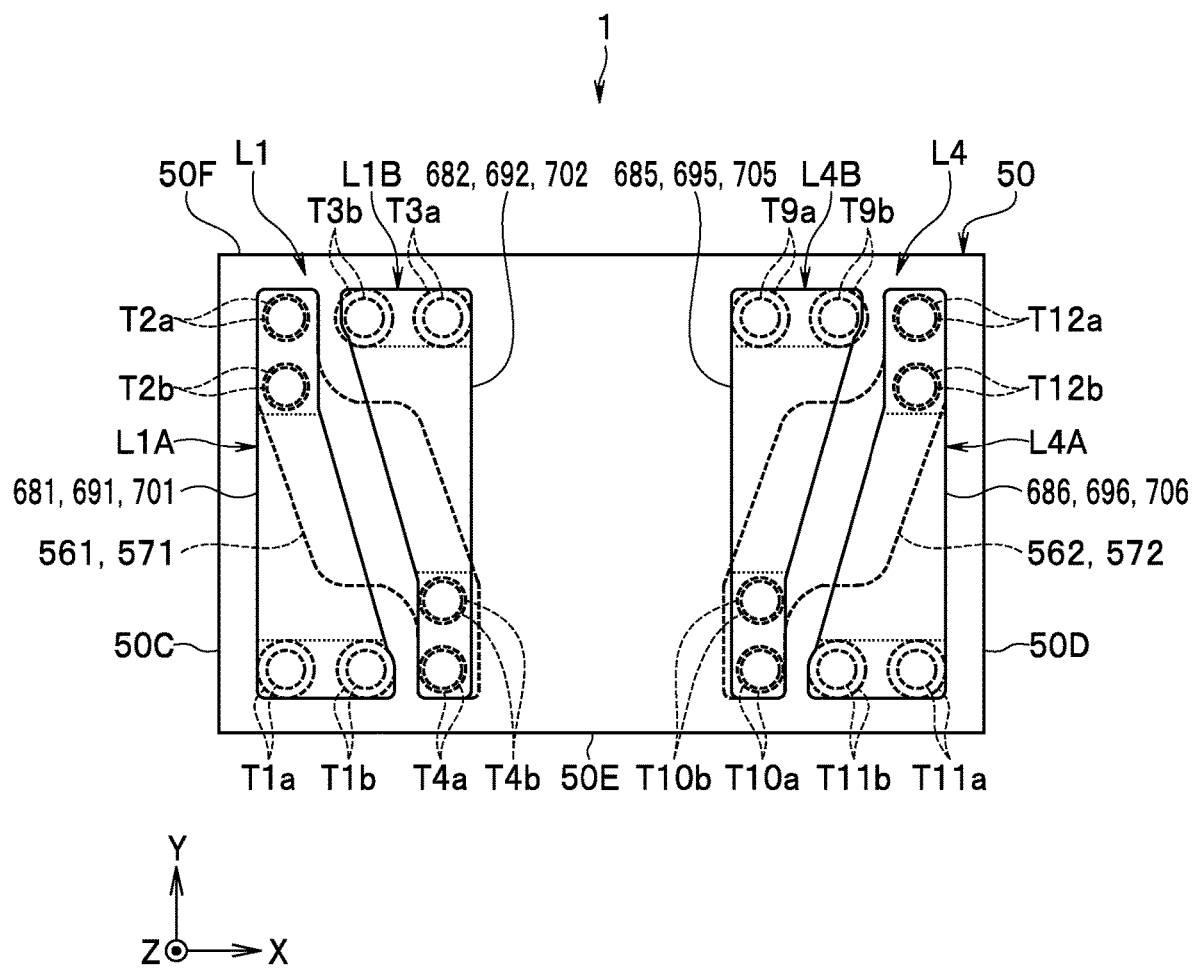
FIG. 8 is a plan view showing a part of the internal structure of the stack shown in FIG. 7.

Next, structural features of the electronic component 1 according to the present embodiment will be described with reference to FIG. 3A to FIG. 8. FIG. 8 is a plan view showing a part of the internal structure of the stack 50, or more specifically, the inductors L1 and L4. The inductor L1 will initially be described. As shown in FIG. 8, the inductor L1 includes a first inductor forming section L1A, a second inductor forming section L1B, and the connection conductor layers 561 and 571.

Each of the first and second inductor forming sections L1A and L1B includes a plurality of first through hole lines and a plurality of second through hole lines. The plurality of first through hole lines are formed by connecting two or more first through holes in series. The plurality of second through hole lines are formed by connecting two or more second through holes in series. In each of the first and second inductor forming sections L1A and L1B, the number of first through hole lines and the number of second through hole lines are the same.

In each of the first and second inductor forming sections L1A and L1B, the plurality of first through hole lines are arranged in one direction orthogonal to the stacking direction T of the dielectric layers 51 to 71. The plurality of second through hole lines are arranged in another direction orthogonal to the stacking direction T of the dielectric layers 51 to 71. In the present embodiment, the plurality of first through hole lines in both the first and second inductor forming sections L1A and L1B are arranged in a first direction. In the present embodiment, the plurality of second through hole lines in both the first and second inductor forming sections L1A and L1B are arranged in a second direction intersecting the first direction. The first direction and the second direction may be orthogonal to each other. In the present embodiment, one of the first and second directions is parallel to the longitudinal direction of the inductor conductor layers (vertical direction in FIG. 5C to FIG. 6B), i.e., the Y direction. The other of the first and second directions is parallel to the transverse direction of the inductor conductor layers (horizontal direction in FIG. 5C to FIG. 6B), i.e., the X direction.

In the present embodiment, the plurality of first through hole lines of the first inductor forming section L1A are two first through hole lines T1a and T1b. The plurality of second through hole lines of the first inductor forming section L1A are two second through hole lines T2a and T2b. In the first inductor forming section L1A, the two first through hole lines T1a and T1b are formed by connecting vertically adjoining ones of the through holes 52T1, 53T1, 54T1, 55T1, 56T1, 57T1, 58T1, 68T1, and 69T1. In the first inductor forming section L1A, the two second through hole lines T2a and T2b are formed by connecting vertically adjoining through holes of the through holes 56T2, 57T2, 58T2, 68T2, and 69T2. As shown in FIG. 8, the two first through hole lines T1a and T1b are arranged in the direction parallel to the X direction. The two second through hole lines T2a and T2b are arranged in the direction parallel to the Y direction.

In the present embodiment, the plurality of first through hole lines of the second inductor forming section L1B are two first through hole lines T3a and T3b. The plurality of second through hole lines of the second inductor forming section L1B are two second through hole lines T4a and T4b. In the second inductor forming section L1B, the two first through hole lines T3a and T3b are formed by connecting vertically adjoining ones of the through holes 53T3, 54T3, 55T3, 56T3, 57T3, 58T3, 68T3, and 69T3. In the second inductor forming section L1B, the two second through hole lines T4a and T4b are formed by connecting vertically adjoining through holes of the through holes 56T4, 57T4, 58T4, 68T4, and 69T4. As shown in FIG. 8, the two first through hole lines T3a and T3b are arranged in the direction parallel to the X direction. The two second through hole lines T4a and T4b are arranged in the direction parallel to the Y direction.

The first inductor forming section L1A further includes the inductor conductor layers 681, 691, and 701. The second inductor forming section L1B further includes the inductor conductor layers 682, 692, and 702. Each of the inductor conductor layers 681, 682, 691, 692, 701, and 702 includes a wide portion including the wide end, a narrow portion including the narrow end, and a width changing portion interposed between the narrow portion and the wide portion. In FIG. 5C to FIG. 6B and FIG. 8, the border between the wide portion and the width changing portion and the border between the narrow portion and the width changing portion are shown by a dotted line each. In FIG. 6B, the reference numerals 701a, 701b, and 701c denote the wide portion, the narrow portion, and the width changing portion of the inductor conductor layer 701, respectively. The reference numerals 702a, 702b, and 702c denote the wide portion, the narrow portion, and the width changing portion of the inductor conductor layer 702, respectively.

As employed herein, the dimension of each of the wide portion, the narrow portion, and the width changing portion in a direction parallel to the transverse direction of the inductor conductor layer, i.e., the X direction shown in FIG. 8 will be referred to as a width. In each of the inductor conductor layers 681, 682, 691, 692, 701, and 702, the narrow portion has a width smaller than that of the wide portion. In each of the inductor conductor layers 681, 682, 691, 692, 701, and 702, the width of the width changing portion increases as the distance of the width changing portion from the narrow portion increases. In each of the inductor conductor layers 681, 682, 691, 692, 701, and 702, the narrow portion and the wide portion may each have a constant width regardless of distance from the width changing portion. Alternatively, the narrow portion and the wide portion may each vary in width at least in part depending on the distance from the width changing portion.

The wide portions of the inductor conductor layers 681, 691, and 701 adjoin the narrow portions of the inductor conductor layers 682, 692, and 702, respectively, at a predetermined distance. The narrow portions of the inductor conductor layers 681, 691, and 701 adjoin the wide portions of the inductor conductor layers 682, 692, and 702, respectively, at a predetermined distance.

The plurality of first through hole lines are connected to one of the wide portion and the narrow portion, and the plurality of second through hole lines are connected to the other of the wide portion and the narrow portion. In the first inductor forming section L1A, the two first through hole lines T1a and T1b are connected to the wide portion of each of the inductor conductor layers 681, 691, and 701. The two second through hole lines T2a and T2b are connected to the narrow portion of each of the inductor conductor layers 681, 691, and 701. In the second inductor forming section L1B, the two first through hole lines T3a and T3b are connected to the wide portion of each of the inductor conductor layers 682, 692, and 702. The two second through hole lines T4a and T4b are connected to the narrow portion of each of the inductor conductor layers 682, 692, and 702.

The connection conductor layers 561 and 571 connect a plurality of portions of the plurality of second through hole lines T2a and T2b of the first inductor forming section L1A away from the inductor conductor layers 681, 691, and 701 to a plurality of portions of the plurality of second through hole lines T4a and T4b of the second inductor forming section L1B away from the inductor conductor layers 682, 692, and 702.

Next, the inductor LA will be described. The structural features of the inductor L4 are the same as those of the inductor L1 except that the inductor LA is composed of conductor layers and through holes different from those of the inductor L1. The structure of the inductor L4 will be described below. As shown in FIG. 8, the inductor L4 includes a first inductor forming section L4A, a second inductor forming section L4B, and the connection conductor layers 562 and 572.

The first inductor forming section L4A includes two first through hole lines T11a and T11b and two second through hole lines T12a and T12b. In the first inductor forming section L4A, the two first through hole lines T11a and T11b are formed by connecting vertically adjoining through holes of the through holes 52T11, 53T11, 54T11, 55T11, 56T11, 57T11, 58T11, 68T11, and 69T11. In the first inductor forming section L4A, the two second through hole lines T12a and T12b are formed by connecting vertically adjoining through holes of the through holes 56T12, 57T12, 58T12, 68T12, and 69T12. As shown in FIG. 8, the two first through hole lines T11a and T11b are arranged in the direction parallel to the X direction. The two second through hole lines T12a and T12b are arranged in the direction parallel to the Y direction.

The second inductor forming section L4B includes two first through hole lines T9a and T9b and two second through hole lines T10a and T10b. In the second inductor forming section L4B, the two first through hole lines T9a and T9b are formed by connecting vertically adjoining through holes of the through holes 53T9, 54T9, 55T9, 56T9, 57T9, 58T9, 68T9, and 69T9. In the second inductor forming section L4B, the two second through hole lines T10a and T10b are formed by connecting vertically adjoining through holes of the through holes 56T10, 57T10, 58T10, 68T10, and 69T10. As shown in FIG. 8, the two first through hole lines T9a and T9b are arranged in the direction parallel to the X direction. The two second through hole lines T10a and T10b are arranged in the direction parallel to the Y direction.

The first inductor forming section L4A further includes the inductor conductor layers 686, 696, and 706. The second inductor forming section L4B further includes the inductor conductor layers 685, 695, and 705. Each of the inductor conductor layers 685, 686, 695, 696, 705, and 706 includes a wide portion including a wide end, a narrow portion including a narrow end, and a width changing portion interposed between the narrow portion and the wide portion. In FIG. 6B, the reference numerals 705a, 705b, and 705c denote the wide portion, the narrow portion, and the width changing portion of the inductor conductor layer 705, respectively. The reference numerals 706a, 706b, and 706c denote the wide portion, the narrow portion, and the width changing portion of the inductor conductor layer 706, respectively.

The wide portions of the inductor conductor layers 685, 695, and 705 adjoin the narrow portions of the inductor conductor layers 686, 696, and 706, respectively, at a predetermined distance. The narrow portions of the inductor conductor layers 685, 695, and 705 adjoin the wide portions of the inductor conductor layers 686, 696, and 706, respectively, at a predetermined distance.

In the first inductor forming section L4A, the two first through hole lines T11a and T11b are connected to the wide portion of each of the inductor conductor layers 686, 696, and 706. The two second through hole lines T12a and T12b are connected to the narrow portion of each of the inductor conductor layers 686, 696, and 706. In the second inductor forming section L4B, the two first through hole lines T9a and T9b are connected to the wide portion of each of the inductor conductor layers 685, 695, and 705. The two second through hole lines T10a and T10b are connected to the narrow portion of each of the inductor conductor layers 685, 695, and 705.

The connection conductor layers 562 and 572 connect a plurality of portions of the plurality of second through hole lines T12a and T12b of the first inductor forming section L4A away from the inductor conductor layers 686, 696, and 706 to a plurality of portions of the plurality of second through hole lines T10a and T10b of the second inductor forming section L4B away from the inductor conductor layers 685, 695, and 705.

Figure 9:
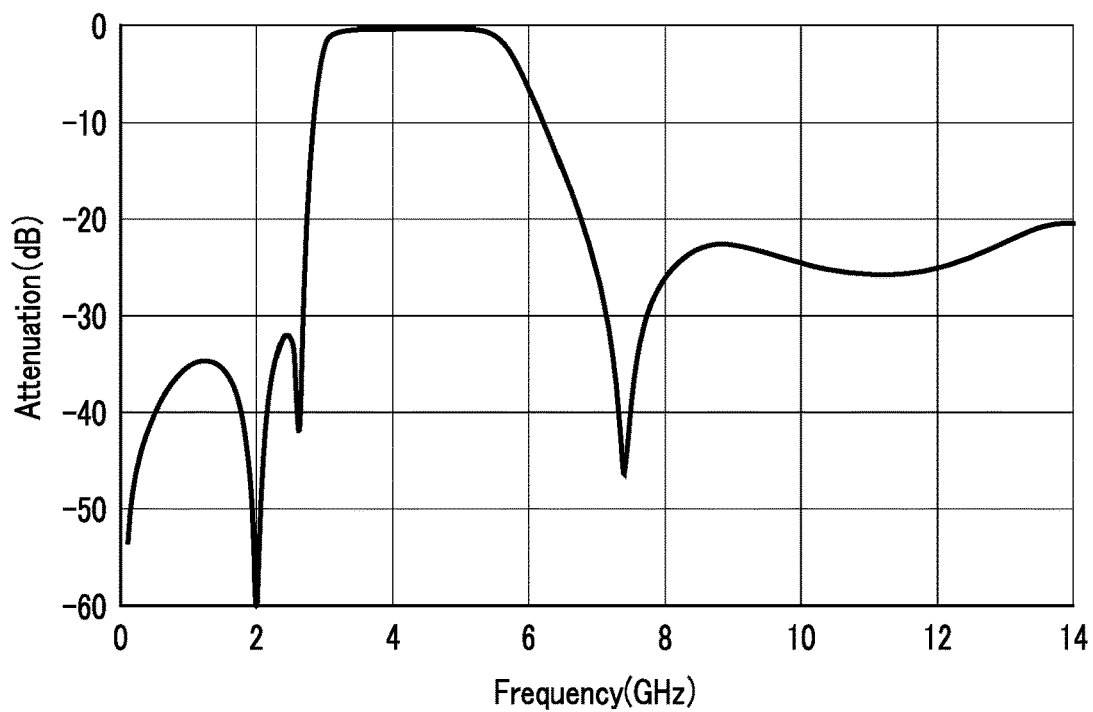
FIG. 9 is a characteristic chart showing an example of a pass characteristic of the multilayer electronic component according to the embodiment of the present invention.
Figure 10:
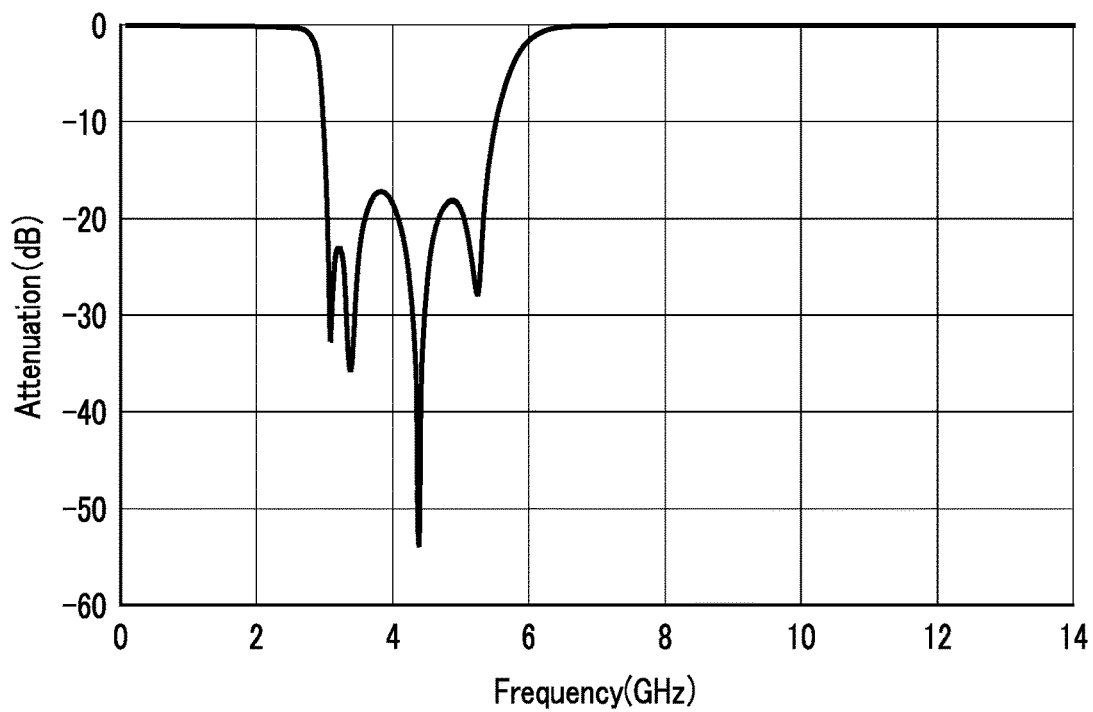
FIG. 10 is a characteristic chart showing an example of a reflection characteristic at a first port of the multilayer electronic component according to the embodiment of the present invention.
Figure 11:
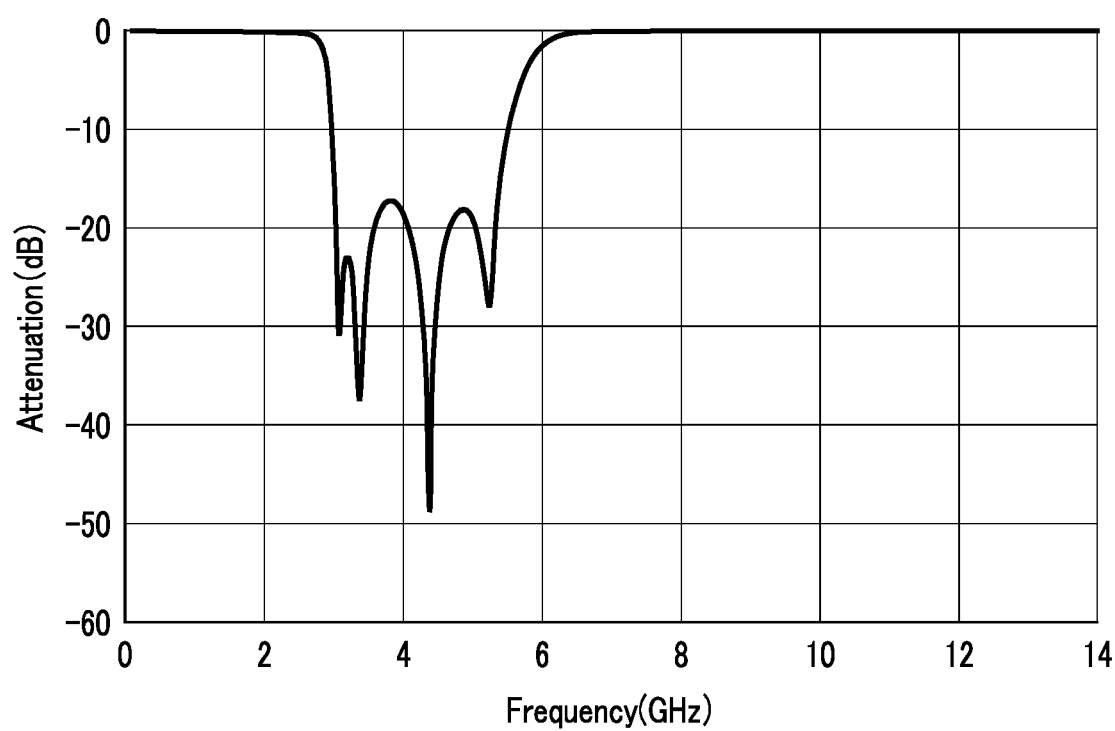
FIG. 11 is a characteristic chart showing an example of a reflection characteristic at a second port of the multilayer electronic component according to the embodiment of the present invention.

Next, examples of the characteristics of the electronic component 1 according to the present embodiment will be described. FIG. 9 is a characteristic chart showing an example of a pass characteristic of the electronic component 1. FIG. 10 is a characteristic chart showing an example of a reflection characteristic at the first port 2 of the electronic component 1. FIG. 11 is a characteristic chart showing an example of a reflection characteristic at the second port 3 of the electronic component 1. In FIG. 9 to FIG. 11, the horizontal axis indicates frequency, and the vertical axis the attenuation.

Next, the operation and effects of the electronic component 1 according to the present embodiment will be described. The electronic component 1 according to the present embodiment includes the stack 50 including the plurality of dielectric layers 51 to 71 stacked together, the first and second inductor forming sections L1A and L1B integrated with the stack 50, and the connection conductor layers 561 and 571 connecting the first inductor forming section L1A and the second inductor forming section L1B inside the stack 50. The first and second inductor forming sections L1A and L1B and the connection conductor layers 561 and 571 constitute one inductor L1. One inductor refers to an inductor that is expressed as a single inductor on a circuit diagram. There is no branching point between one end and the other end of the one inductor.

In the present embodiment, the inductor L1 is wound approximately two turns around an axis parallel to the X direction. According to the present embodiment, the inductance of the inductor L1 can thus be increased.

In the present embodiment, the wide portions of the inductor conductor layers 681, 691, and 701 of the first inductor forming section L1A adjoin the narrow portions of the inductor conductor layers 682, 692, and 702 of the second inductor forming section L1B, respectively, at a predetermined distance. The narrow portions of the inductor conductor layers 681, 691, and 701 of the first inductor forming section L1A adjoin the wide portions of the inductor conductor layers 682, 692, and 702 of the second inductor forming section L1B, respectively, at a predetermined distance. According to the present embodiment, the installation space of the inductor L1 can thus be reduced.

In the first inductor forming section L1A, the two first through hole lines T1$a$ and T1$b$ are connected to the wide portion of each of the inductor conductor layers 681, 691, and 701. The two second through hole lines T2$a$ and T2$b$ are connected to the narrow portion of each of the inductor conductor layers 681, 691, and 701. In the second inductor forming section L1B, the two first through hole lines T3$a$ and T3$b$ are connected to the wide portion of each of the inductor conductor layers 682, 692, and 702. The two second through hole lines T4$a$ and T4$b$ are connected to the narrow portion of each of the inductor conductor layers 682, 692, and 702. In the present embodiment, the number of through hole lines connected to the narrow portion of each of the inductor conductor layers 681, 691, and 701 is thus made the same as the number of through hole lines connected to the wide portion of each of the inductor conductor layers 681, 691, and 701. Moreover, the number of through hole lines connected to the narrow portion of each of the inductor conductor layers 682, 692, and 702 is made the same as the number of through hole lines connected to the wide portion of each of the inductor conductor layers 682, 692, and 702. According to the present embodiment, the Q value of the inductor L1 can thus be increased compared to the case where the number of through hole lines connected to the narrow portion is smaller than the number of through hole lines connected to the wide portion.

The stack 50 is fabricated by, for example, low temperature co-firing. Dielectric materials for forming the dielectric layers and conductive material for forming the through holes typically have different shrinkage rate during firing. If the number of through hole lines connected to one of the narrow and wide portions is greater than the number of through hole lines connected to the other of the narrow and wide portions, the through holes are unevenly distributed. In such a case, desired characteristics are difficult to obtain due to the occurrence of unintended internal stress in the fired dielectric layers. In the present embodiment, the number of through hole lines connected to the narrow portion and the number of through hole lines connected to the wide portion are thus made the same to prevent the occurrence of unintended internal stress.

The foregoing description of the inductor L1 also applies to the inductor L4.

According to the present embodiment, the inductors L1 and L4 that have favorable characteristics and are suited for the miniaturization of the electronic component 1 can thus be implemented.

The present invention is not limited to the foregoing embodiment, and various modifications may be made thereto. For example, the electronic component according to the present invention may be one including a filter other than the band-pass filter in addition to or instead of the band-pass filter. In the case where the filter other than the band-pass filter is provided in addition to the band-pass filter, the filter other than the band-pass filter may or may not include the inductor according to the present invention.

The planar shapes (shapes seen from above) of the inductor conductor layers are not limited to the examples described in the embodiment and may take different shapes as long as the requirements set forth in the claims are satisfied. For example, the planar shape of the inductor conductor layers may be an L-like shape.

The first through hole lines and the second through hole lines may be arranged in respective directions intersecting the longitudinal or transverse direction of the inductor conductor layers. The numbers of the first and second through hole lines may be three or more.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:
1. A multilayer electronic component comprising:
a stack including a plurality of dielectric layers stacked together;
a first inductor forming section and a second inductor forming section that are integrated with the stack; and
a connection conductor layer that connects the first inductor forming section and the second inductor forming section inside the stack, wherein:
each of the first and second inductor forming sections includes an inductor conductor layer, a plurality of first through hole lines, and a plurality of second through hole lines;
each of the first through hole lines is formed by connecting two or more first through holes in series;
each of the second through hole lines is formed by connecting two or more second through holes in series;
a number of first through hole lines and a number of second through hole lines are the same;
in each of the first and second inductor forming sections, the plurality of first through hole lines are arranged in one direction orthogonal to a stacking direction of the dielectric layers, and the plurality of second through hole lines are arranged in another direction orthogonal to the stacking direction of the dielectric layers;
the inductor conductor layer has a wide end and a narrow end located at opposite ends in a longitudinal direction of the inductor conductor layer;
the inductor conductor layer includes a wide portion including the wide end and a narrow portion including the narrow end;

a dimension of the narrow portion in a transverse direction of the inductor conductor layer is smaller than a dimension of the wide portion in the transverse direction of the inductor conductor layer;

the wide portion of the inductor conductor layer of the first inductor forming section and the narrow portion of the inductor conductor layer of the second inductor forming section adjoin at a predetermined distance;

the narrow portion of the inductor conductor layer of the first inductor forming section and the wide portion of the inductor conductor layer of the second inductor forming section adjoin at a predetermined distance;

in each of the first and second inductor forming sections, the plurality of first through hole lines are connected to one of the wide and narrow portions, and the plurality of second through hole lines are connected to the other of the wide and narrow portions; and the connection conductor layer connects a plurality of portions of the plurality of second through hole lines of the first inductor forming section away from the inductor conductor layer to a plurality of portions of the plurality of second through hole lines of the second inductor forming section away from the inductor conductor layer.

2. The multilayer electronic component according to claim 1, wherein the plurality of first through hole lines are arranged in a first direction, and the plurality of second through hole lines are arranged in a second direction intersecting the first direction.

3. The multilayer electronic component according to claim 2, wherein the first direction and the second direction are orthogonal to each other.

4. The multilayer electronic component according to claim 2, wherein:

one of the first and second directions is parallel to a longitudinal direction of the inductor conductor layer; and the other of the first and second directions is parallel to the transverse direction of the inductor conductor layer.

5. The multilayer electronic component according to claim 1, wherein:

the inductor conductor layer further includes a width changing portion interposed between the narrow portion and the wide portion; and a dimension of the width changing portion in the transverse direction of the inductor conductor layer increases as a distance of the width changing portion from the narrow portion increases.

6. The multilayer electronic component according to claim 1, wherein the first inductor forming section, the second inductor forming section, and the connection conductor layer constitute an inductor.

7. The multilayer electronic component according to claim 6, further comprising:

a first port;

a second port; and a plurality of resonators that are provided between the first port and the second port in a circuit configuration and are configured so that two adjoining resonators in the circuit configuration are electromagnetically coupled to each other, wherein:

the first port, the second port, and the plurality of resonators are integrated with the stack;

the plurality of resonators include a first resonator closest to the first port in the circuit configuration and a second resonator closest to the second port in the circuit configuration; and each of the first and second resonators includes the inductor.

* * * * *